United States Patent
Lucey, Jr.

(10) Patent No.: US 6,207,892 B1
(45) Date of Patent: Mar. 27, 2001

(54) SYSTEM AND METHOD FOR SEALING HIGH DENSITY ELECTRONIC CIRCUITS

(75) Inventor: George K. Lucey, Jr., Burtonsville, MD (US)

(73) Assignee: The United States of America as represented by the Secretary of the Army, Washington, DC (US)

( * ) Notice: Subject to any disclaimer, the term of this patent is extended or adjusted under 35 U.S.C. 154(b) by 0 days.

(21) Appl. No.: 08/413,521

(22) Filed: Mar. 30, 1995

(51) Int. Cl.$^7$ ....................................... H05K 5/00
(52) U.S. Cl. ....................... 174/17 LF; 174/50.5
(58) Field of Search ................. 174/17 LF, 50.5

(56) References Cited

U.S. PATENT DOCUMENTS

| | | | |
|---|---|---|---|
| 3,229,023 | * 10/1966 | Bolton et al. ................ | 174/17 R |
| 4,056,681 | * 11/1977 | Cook, Jr. ........................ | 174/52 |
| 4,786,864 | * 11/1988 | Beha et al. .................... | 324/158 R |
| 4,918,511 | * 4/1990 | Brown ............................ | 357/70 |
| 4,953,005 | * 8/1990 | Carlson et al. ............... | 357/80 |

FOREIGN PATENT DOCUMENTS

2518812 * 12/1981 (FR) .................. 174/17 LF

* cited by examiner

Primary Examiner—Kristine Kincaid
Assistant Examiner—Dhiru R Patel
(74) Attorney, Agent, or Firm—Paul S. Clohan, Jr.

(57) ABSTRACT

A method and system for extending the life cycle of an circuit including the positioning of a circuit on an an elevated pedestal in a container, filling the container with a hydrophobic fluid sufficiently to form a bubble at the top of the package, and sealing the package. On the contamination of the container by a condensate, the pedestal segregates the circuit from the condensate regardless of the containers orientation.

10 Claims, 2 Drawing Sheets

SYSTEM AND METHOD FOR SEALING HIGH DENSITY ELECTRONIC CIRCUITS

RIGHTS OF THE GOVERNMENT

The invention described herein may be manufactured, used and licensed by or for the Government for Governmental purpose without the payment to me of any royalties thereon.

BACKGROUND OF INVENTION

1. Technical Field

This invention relates to a novel method for sealing high density electronic circuits, such as, integrated circuits, by positioning the circuit on a pedestal in the interior of a container. The container is filled with a hydrophobic liquid sufficiently to immerse the circuit and form a bubble at the top of the container.

2. Background Information

High density electronics, such as, integrated circuits, hybrids circuits, optical-electronics, etc. are increasingly manufactured with thin-film metals, such as gold, aluminum, nickel etc.. When the metals are exposed to ionic contaminants, temperatures and electrical voltage; corrosion causes a degradation in electrical performance. Protection against corrosion is provided by isolating the material against moisture. This is accomplished by applying a protective coating on the electronic circuits such as silicon dioxide, silicon Nitride epoxy and the like. Protection is also provided by positioning the electronic circuit in a moisture resistant container constructed of metal, glass, or a ceramic. These containers are generally assembled from two or more parts sealed by soldering, welding or glass bonding process.

MIL-STD 1014 is one standard for testing/qualifying leakage rates of hermetically sealed microcircuits. In this test containers are allowed to have leak rates up between $1 \times 10^{-7}$ and $5 \times 10^{-8}$ atm-cm/sec (volume dependent). This, however has been shown to allow moisture penetration sufficient to cause failure of the device by corrosion within 1 year. Consequently, even though a device has passed this test, its extended life is unknown.

SUMMARY AND OBJECTS OF THE INVENTION

The present method relates to an improved method of isolating high density electronic circuits from detrimental contaminants comprising the immersion and maintenance of the circuit in a hydrophobic liquid of a package or container to prolong their life cycle. The electronic circuit is mounted on a pedestal to preclude the contamination of the electronic assembly with condensed moisture or air bubble by maintaining its immersion in the fluid.

It is an object of the present invention to provide and disclose an improved method for sealing high density electronic circuits.

It is a further object of the invention to provide and disclose a method for protecting high density electronic circuits from harmful substances which obviates the need for hermetic sealing.

It is a further object of the invention to provide and disclose an improved method for sealing high density electronic circuits sufficient to assure a life cycle equivalent to or better than current hermetic packaging methods.

It is a further object of the invention to provide and disclose an improved method of sealing of a high density circuit comprising the immersion of the circuit in a hydrophobic liquid.

It is a further object of the invention to provide and disclose an improved method for sealing high density electronic circuity comprising the positioning of the circuit on a pedestal to avoid contamination of the electronic circuit due to the ingress of contaminants over time.

It is a further object of the invention to provide and disclose an improved method for sealing high density electronic containers which have not been subjected to a protective process.

It is a further object to provide and disclose an improved method for sealing a high density electronic circuit which has been coated with a protective coating.

The forgoing and other objects and advantages of the invention will appear from the following description. In the description, reference is made to the accompanying drawings, which form a part thereof.

BRIEF DESCRIPTION OF THE INVENTION

DESCRIPTION OF THE PREFERRED EMBODIMENT

Figure 1:
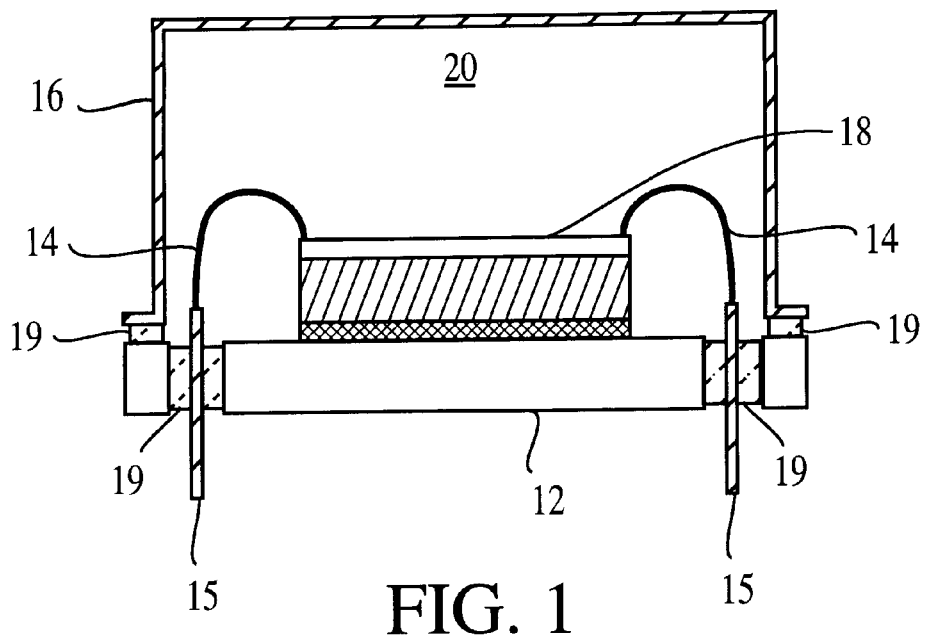
FIG. 1 is a horizontal sectional view of the prior art container of an integrated circuit.

Referring to the drawings, like reference numerals represent identical or corresponding parts through the illustrations.

FIG. 1 relates to a hermetically sealed integrated circuit package manufactured in accordance with existing technology. Integrated circuit die 18, composed of silicon, e.g., is bonded by any conventional adhesive, to ceramic block 12. Die 18 may be coated with any conventional coat, such as silicon dioxide. Metal wire 14 connects the integrated circuit die 18 to leads 15. The system is positioned in metal container 16 and sealed by glass weld or solder at appropriate points, designated 19. In the alternative, an inert gas, such as argon may be introduced into the package.

Figure 2:
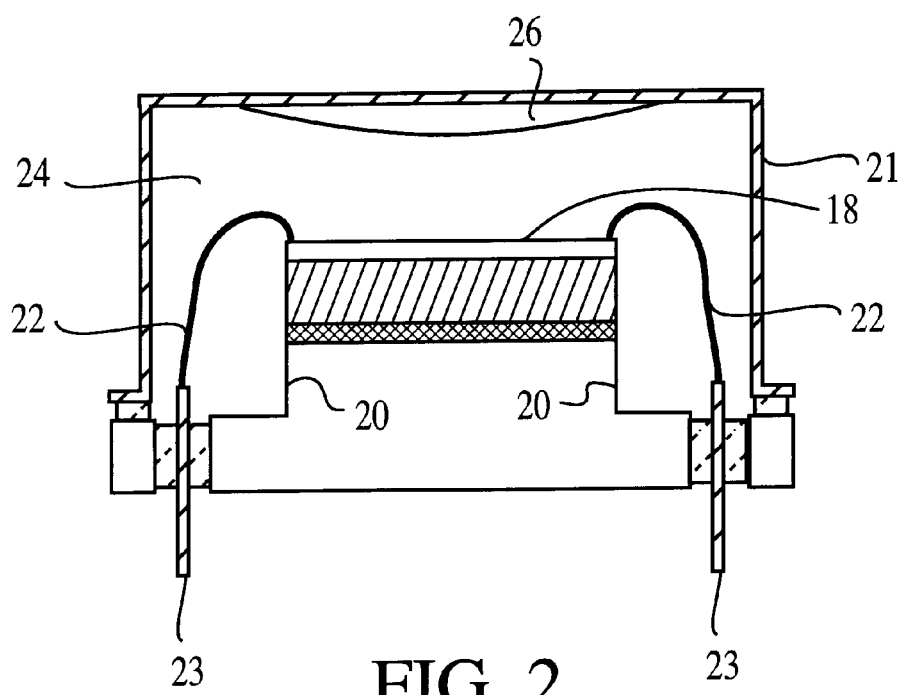
FIG. 2 is a horizontal sectional view of the present invention.

Referring to FIG. 2 of the drawing, there is shown a system of the present invention. The system comprises integrated circuit die 18 positioned on pedestal 20. The system is encompassed in any suitable container 21, such as plastic. Metal wire 22 connects the integrated circuit to leads 23. The package is filled with a hydrophobic liquid completely immersing the integrated circuit and forming a meniscus 26 at the top of the package.

Figure 3:
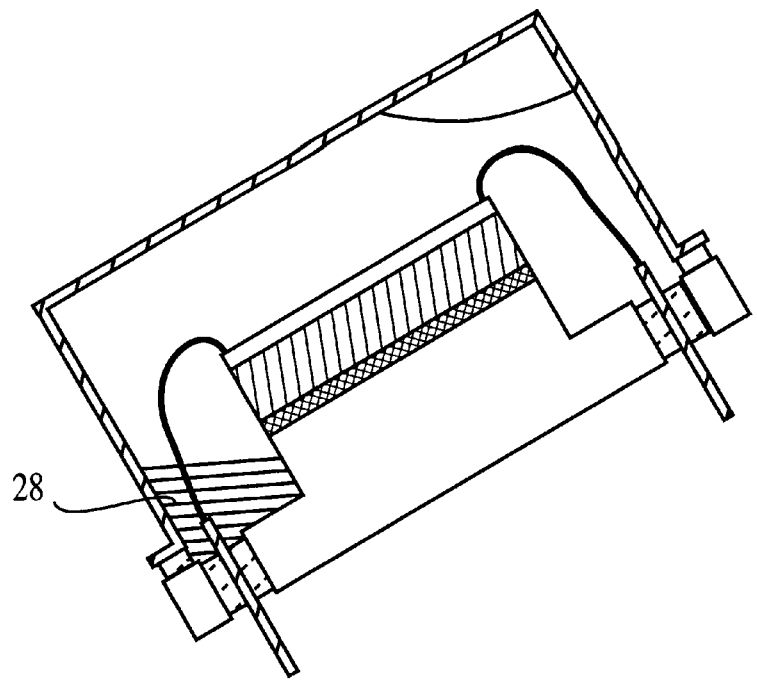
FIGS. 3 and 4 are horizontal sectional views of fields of operation showing the beneficial results acruing from the practice of the invention.

FIG. 3 is an illustration of the invention after long term field operation. Polluted moisture, which has leaked into the package, has condensed (28) outside of the hydrophobic liquid.

In view of the differences in specific gravity between the hydrohobic liquid and the condensate, the latter gravitates toward the bottom of the container and the elevated pedestal segregates the integrated circuit from the condensate regardless of the package orientation. In addition, bubble (meniscus) is substantially reduced.

Figure 4:
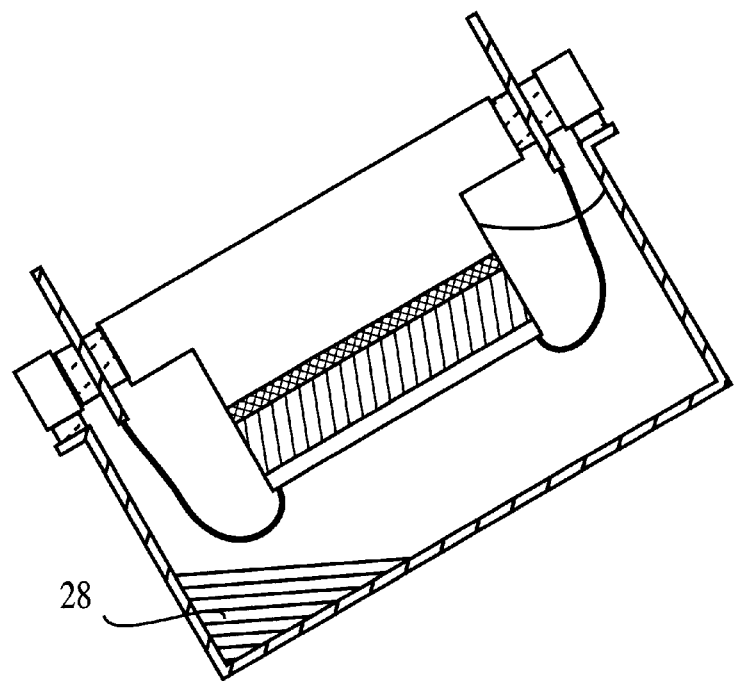

FIG. 4 is another illustration of leaking coupled with tilting of the container in an upside down position. It should be noted that the condensate 28 has gravitated toward the bottom of the container (formally the top). The bubble (meniscus) has gravitated opposite side of the condensate, and completely avoids any contact with the integrated circuit.

SPECIFIC EXAMPLE

Experimentations were conducted to examine the ability hydrohobic fluids, such as hexane and fluorocarbons, for example, to alleviate the problem of corrosion of package integrated circuits due to contact with ion containing water. The hypothesis is that the maximum moisture that comes in contact with the integrated circuit will be limited to the solubility of water in fluid, which in the case of hydrophobic fluids is negligible. The consequence of this would be to highly reduce or perhaps even arrest corrosion of metallization on the chip or on other components such as wire bonds.

The test involved the use of special test chips developed by Sandia National Laboratories (P/N ATCO3) which, among other things, are designed to measure metal corrosion rates on integrated circuits. The chips contain several aluminum tracks which can be monitored for changes in resistance, providing an indication of the corrosion of the metal.

There are four types of track, each with a different susceptibility to corrosion: (1) single metal level/ unpassivated (2) single metal level/passivated with phosphosilicate glass (3) two levels of metal/unpassivated, and (4) two levels of metal/passivated with phosphosilicate.

The chips were packaged in 40 pin Cerdip packages, which were modified with a threaded opening through the lid to allow for controlled exposure of the chip cavity to the external environment.

The procedure of the test is to expose the chip cavity to the test fluid at elevated temperature (80 C.), periodically removing them to determine resistance changes in the track.

The test fluid used were:

(1) Spectral Grade Hexane contaminated with its maximum solubility of acid rain water.

(2) acid rain water. The acid rain water comprised a solution of 65% $H_2SO_4$, 30% $HNO_3$, and 5% HCL mixed with sufficient distilled water to produce a 4 pH solution.

DETAILED RESULTS (a) Immersion in contaminated hexane:

1. Number of tracts tested . . . 22
2. Failure after 838 hours testing . . . none
3. Average % change in resistance of track after 838 hours . . . +0.17%
4. Mean time to failure of track . . . more than 3600 hrs.

(b) Immersion in acid rain water:

1. Number of tracks tested . . . 12
2. Failure after 206 hours of testing . . . 12
3. Mean time for failure of tracks . . . 118 hours The results conclusively demonstrate that immersion in hydrophobic fluids, such as hexane, greatly reduces the corrosive effect in the presence of ion containing water. Even the negligible 17% increase in track resistance of the immersed integrated circuits falls within the measurement error of the test, and cannot be concluded to be due to corrosion.

While a specific embodiment of the present invention has been shown and described, it would be obvious to one skilled in the art that changes and modification may be made without departing from the spirit and scope of the invention.

Having described my invention, I claim:

1. A method for extending a life cycle of a high density electronic circuit by isolation from detrimental contaminants, comprising the steps of:

providing a container capable of being sealed, providing pedestal means positioned on the interior of the container, adding a hydrophobic liquid in an amount sufficient to immerse the electronic circuit and to form a compressible bubble at the top of the container, and sealing the container, so that on the contamination of the container, the elevated pedestal segregates the electronic circuit from a condensate regardless of the container orientation.

2. A method in accordance with claim 1, wherein the electronic circuit is an integrated circuit die.

3. A method in accordance with claim 2, wherein the integrated circuit die is composed of a material selected from the group consisting of silicon and galium arsenide.

4. A method in accordance with claim 2 or 3, wherein the integrated circuit die is coated with a passivation layer.

5. A method in accordance with with claim 4 wherein the hydrophobic fluid is selected from the group consisting of hexane and fluorocarbons.

6. A system for extending a life cycle of an integrated circuit by isolation from contaminating condensates comprising:

a sealable container comprising an interior, a pedestal positioned in the interior thereof, the pedestal suitable contoured to receive an electronic circuit, and a hydrophobic liquid in an amount sufficient to immerse the electronic circuit so as to form a compressible bubble at the top of the container, so that on contamination of the container by the condensate, the pedestal segregates the electronic electronic circuit from the condensate regardless of the container orientation.

7. A system in accordance with claim 6, wherein the electronic circuit is an integrated circuit die.

8. A system in accordance with claim 7, wherein the integrated circuit die is composed of silicon or galium arsenide.

9. A system in accordance with claim 7 or 8, wherein the integrated circuit is coated with a passivation layer.

10. A system in accordance with claim 9 wherein the hydrophobic liquid is selected from the group consisting of hexane and fluorocarbons.

* * * * *